(12) United States Patent
Kakiuchi

(10) Patent No.: US 7,932,561 B2
(45) Date of Patent: Apr. 26, 2011

(54) SEMICONDUCTOR APPARATUS

(75) Inventor: Toshio Kakiuchi, Gunma-ken (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 50 days.

(21) Appl. No.: 11/683,581

(22) Filed: Mar. 8, 2007

(65) Prior Publication Data

US 2007/0211399 A1 Sep. 13, 2007

(30) Foreign Application Priority Data

Mar. 9, 2006 (JP) .................................. 2006-064570

(51) Int. Cl.
*H01L 23/62* (2006.01)
(52) U.S. Cl. .................. 257/355; 257/358; 257/E29.222
(58) Field of Classification Search .................. 257/356, 257/358, 360, 363, 355, E29.222
See application file for complete search history.

(56) References Cited

U.S. PATENT DOCUMENTS 6,469,354 B1 * 10/2002 Hirata ........................... 257/358
2004/0155294 A1 * 8/2004 Hung et al. .................... 257/356

FOREIGN PATENT DOCUMENTS

JP 05-75118 3/1993

* cited by examiner

*Primary Examiner* — Jerome Jackson, Jr.
*Assistant Examiner* — Dale Page
(74) *Attorney, Agent, or Firm* — Westerman, Hattori, Daniels & Adrian, LLP

(57) ABSTRACT

A semiconductor apparatus is equipped with an internal circuit (201) including a semiconductor element (202)(203) and a protection circuit (101) including a semiconductor (102)(103) for protecting the internal circuit (201) against damage from electrostatic discharge (ESD). The semiconductor elements (102)(103) (202)(203) constituting the internal circuit (201) and the protection circuit (101) include an impurity diffusion region (7)(8) connected by an external terminal and a guard band region (6)(5) formed near the impurity diffusion region (7)(8), respectively. A shortest distance (102L)(103L) between the impurity diffusion region (7)(8) and the guard band region (6)(5) in the semiconductor element (102)(103) of the protection circuit (101) is set to be shorter than a shortest distance (202L)(203L) between the impurity diffusion region (7)(8) and the guard band region (6)(5) in the semiconductor element (202)(203) of the internal circuit (201).

10 Claims, 6 Drawing Sheets

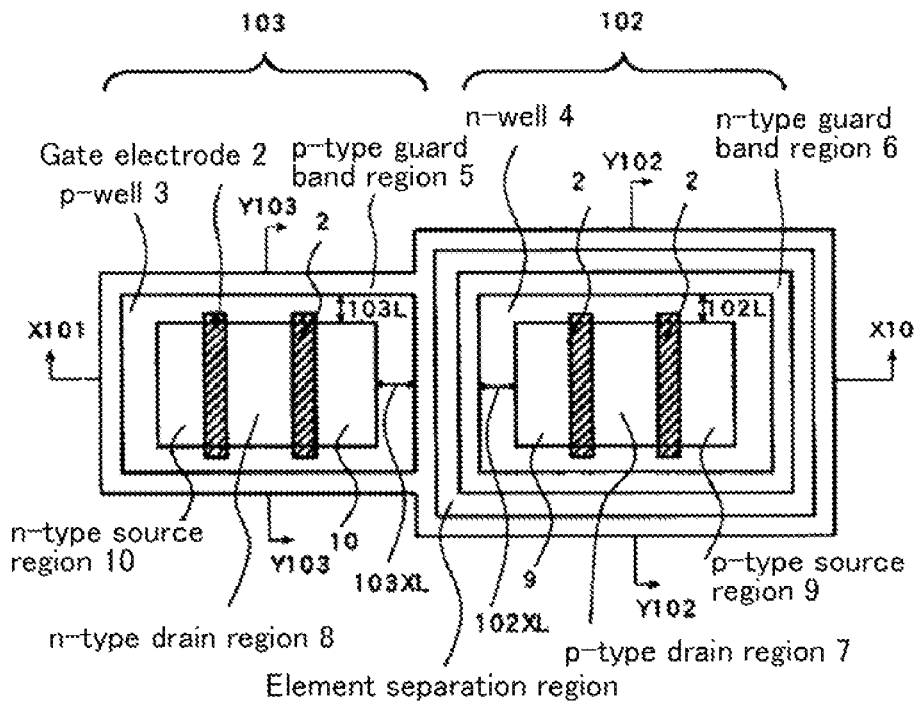
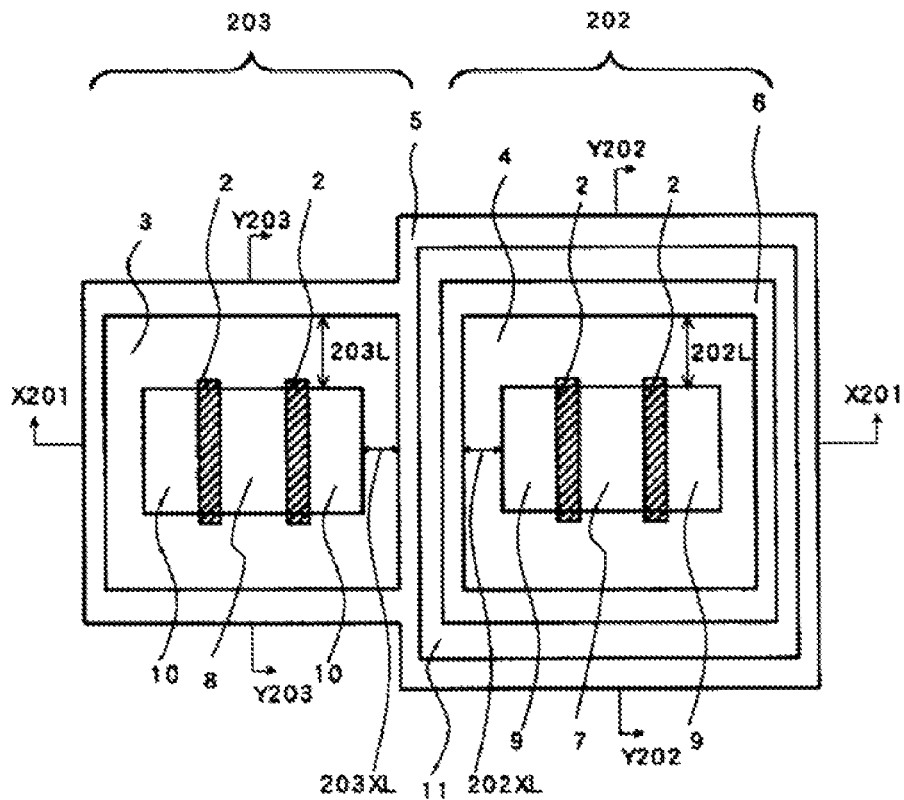
FIG. 2A
FIG. 2B

US 7,932,561 B2

SEMICONDUCTOR APPARATUS

This application claims priority under 35 U.S.C. §119 to Japanese Patent Application No. 2006-064570 filed on Mar. 9, 2006, the entire disclosure of which is incorporated herein by reference in its entirety.

BACKGROUND OF THE INVENTION

1. Field of the Invention

The present invention relates to a semiconductor apparatus. More specifically, it relates to a semiconductor apparatus equipped with an internal circuit including a semiconductor element and a protection circuit including a semiconductor element for protecting the internal circuit against damage from electrostatic discharge (ESD).

2. Description of the Related Art

The following description sets forth the inventor's knowledge of related art and problems therein and should not be construed as an admission of knowledge in the prior art.

A semiconductor integrated circuit includes semiconductor elements, such as, e.g., MOS transistors. Prevention of electrostatic discharge (ESD) damage due to a pulse high voltage generated by electrostatic discharge is a serious concern in such a semiconductor integrated circuit. To prevent such damage, various protection methods have been proposed.

FIG. 1 shows a typical semiconductor integrated circuit equipped with an internal circuit 201 and a protection circuit 101 for protecting the internal circuit against damage from electrostatic discharge (ESD). The protection circuit 101 includes a p-type protection element 102 and an n-type protection element 103 connected between a power source terminal Vdd and a ground terminal GND. An input terminal Vin is connected to a drain connection of the p-type protection element 102 and the n-type protection element 103 constituting the protection circuit 101. Furthermore, the input terminal Vin is designed such that it can be connected to the drain connection of (or source connection) of a p-type internal circuit element 202 and an n-type internal circuit element 203 constituting the internal circuit 201. Through the drain connection (or source connection), an input signal is transmitted into the internal circuit 201.

Conventionally, even in cases where design conditions of the p-type protection element 102 and the n-type protection element 103 are identical to those of the p-type internal circuit element 202 and the n-type internal circuit element 203, the protection circuit 101 could have protected the internal circuit 201 against damage from electrostatic discharge (ESD).

In accordance with the recent advancement of high integration of semiconductor apparatuses, the operation voltage has been lowered and the power consumption has been lowered, and the semiconductor element constituting the semiconductor apparatus has been miniaturized in structure and increased in density. As a result a semiconductor apparatus, especially MOS transistors, have become easily damaged by ESD. Accordingly, the aforementioned protection method has become insufficient against damage from electrostatic discharge (ESD).

In view of the aforementioned problems, it has been proposed that the protection circuit 101 is designed so as to easily release electrostatic stress current by differentiating the design conditions of the semiconductor elements constituting the protection circuit 101 from those of the semiconductor elements constituting the internal circuit 201. For example, Japanese Unexamined Laid-open Patent Publication No. H05-75118 proposes that the p-type protection element 102 and the n-type protection element 103 constituting the protection circuit 101 are set to be shorter in channel length than the p-type internal circuit element 202 and the e-type internal circuit element 203 constituting the internal circuit 201 to enhance the electrostatic stress release function of the protection circuit 101.

The technical means of this proposal, however, has the following technical drawbacks. That is, the limit of shortening the channel length of each of the p-type protection element 102 and the n-type protection element 103 constituting the protection circuit 101 is decided by the durability of hot electron. In other words, the channel length should be set to be longer than the lower limit channel length below the rated voltage due to the lowered voltage endurance by the sudden punchthrough. It is not practical to unlimitedly shorten the channel length. In accordance with the recent high integration of a semiconductor integrated circuit, however, the p-type internal circuit element 202 and the n-type internal circuit element 203 constituting the internal circuit 201 have been shortened in channel length to the aforementioned lower limit. Under the circumstances, there are very limited cases in which the p-type protection element 102 and the n-type protection element 103 constituting the protection circuit 101 can be shorten in channel length than the p-type internal circuit element 202 and the n-type internal circuit element 203 constituting the internal circuit 201.

The same protection effects can be obtained by setting the p-type internal circuit element 202 and the n-type internal circuit element 203 constituting the internal circuit 201 to be longer in channel length than a conventional element. This is, however, impractical since the channel length of the p-type internal circuit element 202 and that of the n-type internal circuit element 203 are decided by the circuit use conditions.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatus.

Among other potential advantages, some embodiments can provide a semiconductor apparatus capable of assuredly protecting an internal circuit against damage from electrostatic discharge (ESD) without shortening the channel length of a semiconductor element constituting a protection circuit for protecting the internal circuit.

Among other potential advantages, some embodiments can provide a semiconductor apparatus simple in structure and capable of assuredly protecting an internal circuit against damage from electrostatic discharge (ESD) and preferably being applied to a semiconductor integrated circuit.

According to one aspect of the present invention, a semiconductor apparatus equipped with an internal circuit including a semiconductor element and a protection circuit including a semiconductor element for protecting the internal circuit against damage from electrostatic discharge (ESD), wherein the semiconductor element constituting the internal circuit includes an impurity diffusion region formed at a surface portion of a substrate of semiconductor material and connected by an external terminal and a guard band region formed near the impurity diffusion region, wherein the semiconductor element constituting the protection circuit includes an impurity diffusion region formed at a surface portion of a substrate of semiconductor material and connected by an external terminal and a guard band region formed near the impurity diffusion region, and wherein a shortest distance between the impurity diffusion region and the guard band region in the semiconductor element of the protection circuit is set to be shorter than a shortest distance between the impurity diffusion region and the guard band region in the semiconductor element of the internal circuit.

In the aforementioned semiconductor apparatus, since the semiconductor element constituting the protection circuit can be broken down prior to the breakdown of the semiconductor constituting the internal circuit without deteriorating the ESD tolerability, the ESD tolerability of the semiconductor can be enhanced.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments an combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which:

FIG. 2A is a schematic explanatory view showing structures of a p-type protection element and an n-type protection element constituting the protection circuit shown in FIG. 1;

FIG. 2B is a schematic explanatory view showing structures of a p-type internal circuit element and an n-type internal circuit element constituting the internal circuit shown in FIG. 1;

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Hereinafter, an embodiment of the present invention will be explained with reference to the attached drawings.

Figure 1:
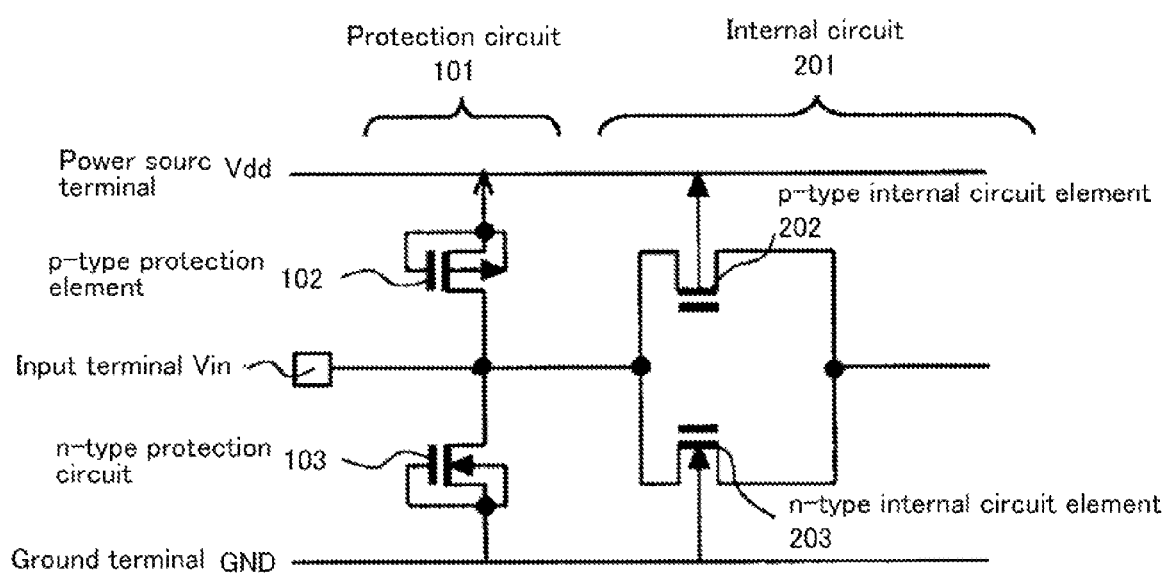
FIG. 1 is a typical example of a semiconductor integrated circuit equipped with an internal circuit and a protection circuit for protecting the internal circuit against damage from electrostatic discharge (ESD)

FIG. 1 shows a typical semiconductor integrated circuit equipped with an internal circuit 201 and a protection circuit 101 for protecting the internal circuit 201 against damage from electrostatic discharge (ESD). The protection circuit 101 includes a p-type protection element 102 and an n-type protection element 103 connected between a power source terminal Vdd and a ground terminal GND.

An input terminal Vin is connected to a drain connection of the p-type protection element 102 and the n-type protection element 103 constituting the protection circuit 101. Furthermore, the input terminal Vin is designed such that it can be connected to the drain connection of (or source connection) of a p-type internal circuit element 202 and an n-type internal circuit element 203 constituting the internal circuit 201. Through the drain connection (or source connection), an input signal is transmitted into the internal circuit 201. In this embodiment, the p-type protection element 102 is a p-channel MOS transistor, and the n-type protection element 103 is an n-channel MOS transistor.

With this structure of the aforementioned input protection circuit 101, when electrostatic pulses are impressed between the input terminal Vin and the ground terminal GND, before stress is applied to the internal circuit 201, the static electricity is discharged to the ground terminal GND via the input terminal Vin and the n-type protection element 103. Thus, the internal circuit 201 is protected. In the same manner, when electrostatic pulses are impressed between the input terminal Vin and the power source terminal Vdd, before stress is applied to the internal circuit 201, the static electricity is discharged to the power source terminal Vdd via the input terminal Vin and the p-type protection element 102. Thus, the internal circuit 201 is protected.

FIG. 2 show schematic explanatory views of CMOS inverters of the protection circuit 101 and the internal circuit 201. FIG. 2A is a schematic explanatory view of protection elements 102 and 103 constituting the protection circuit 101 and FIG. 2B is a schematic explanatory view of internal circuit elements 202 and 203 constituting the internal circuit 201.

Each of the n-type protection element 103 and the n-type internal circuit element 203 is constituted by a p-well 3 formed on the surface area of a semiconductor substrate 1, a rectangular-shaped p-type guard band region 5 for fixing the electric potential of the p-well 3, n-type source regions 10 and 10 and an n-type drain region 8 formed in the area surrounded by the p-type guard band region 5, and gate electrodes 2 and 2 each formed between the n-type source region 10 and the n-type drain region 8. Thus, the drain region 8 and the source regions 10 and 10 are entirely surrounded by the rectangular-shaped guard band region 5.

Furthermore, each of the p-type protection element 102 and the p-type internal circuit element 202 is constituted by an n-well 4 formed on the surface area of a semiconductor substrate 1, a rectangular-shaped n-type guard band region 6 for fixing the electric potential of the n-well 4, p-type source regions 9 and 9 and a p-type drain region 7 formed in the area surrounded by the n-type guard band region 6, and gate electrodes 2 and 2 each formed between the p-type source region 9 and the p-type drain region 7. Thus, the drain region 7 and the source regions 9 and 9 are entirely surrounded by the rectangular-shaped guard band region 6.

Now, the distance between each element 102, 103, 202 and 203 and the guard band region 5 and 6 will be defined. That is, as shown in FIG. 2A, the distance between the n-type drain region 8 and the p-type guard band region 5 of the n-type protection element 103 is defined as "103L", and the distance between the p-type drain region 7 and the n-type guard band region 6 of the p-type protection element 102 is defined as "102L." In this embodiment, each of the guard band regions 5 and 6 is formed into a rectangular shape, and therefore the above-defined distance is constant along the side edge of the drain region 7 and 8. Accordingly, each of the aforementioned distances corresponds to the shortest distance thereof. In the same manner, as shown in FIG. 2B, the distance between the n-type drain region 8 and the p-type guard band region 5 of the n-type protection element 203 is defined as "203L", and the distance between the p-type drain region 7 and the n-type guard band region 6 of the p-type protection element 202 is defined as "202L." In this embodiment, each of the guard band regions 5 and 6 is formed into a rectangular shape, and therefore the above-defined distance is constant along the side edge of the drain region 7 and 8. Accordingly, each of the aforementioned distances corresponds to the shortest distance thereof.

Next, the distance between the source region 9(10) and the guard band region 6(5) in the direction crossing the source region 9(10) and the drain region 7(8) in each element 102, 103, 202 will be defined. That is, as shown in FIG. 2A, the distance between the n-type source region 10 and the p-type guard band region 5 of the n-type protection element 103 is defined as "103XL", and the distance between the p-type source region 9 and the n-type guard band region 6 of the p-type protection element 102 is defined as "102XL." In the same manner, as shown in FIG. 2B, the distance between the n-type source region 10 and the p-type guard band region 5 of the n-type protection element 203 is defined as "203XL", and the distance between the p-type source region 9 and the n-type guard band region 6 of the p-type protection element 202 is defined as "202XL."

FIGS. 3 to 5 are explanatory views showing the cross-sectional structures of the COMS inverters constituting the aforementioned protection circuit 101 and the internal circuit 201.

Figure 3A:
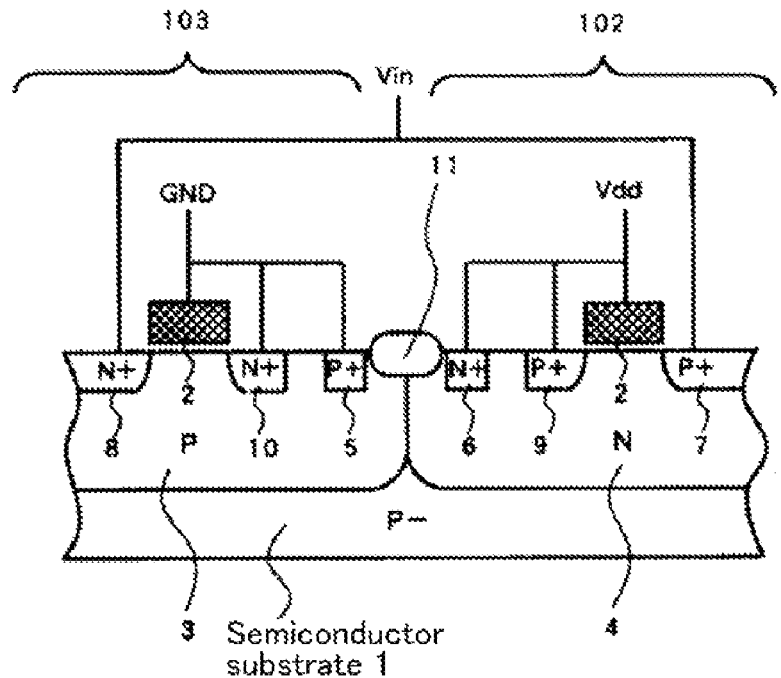
FIG. 3A is a partial schematic cross-sectional view taken along the line X101-X101 in FIG. 2.

FIG. 3A is a partial schematic cross-sectional explanatory view of the protection elements 103 and 102 constituting the protection circuit 101 taken along the line X101-X101 in FIG. 2A. The gate electrode 2 of the n-type protection element 103, the n-type source region 10 and the p-type guard band region 5 are connected to the ground terminal GND to maintain a ground potential. On the other hand, the gate electrode 2 of the type protection element 102, the p-type source region 9 and the n-type guard band region 6 are connected to the power source terminal Vdd to maintain a power source potential. Furthermore, the n-type drain region 8 of the n-type protection element 103 and the p-type drain region 7 of the p-type protection element 102 are connected to the input terminal Vin to maintain a potential Vin.

Figure 3B:
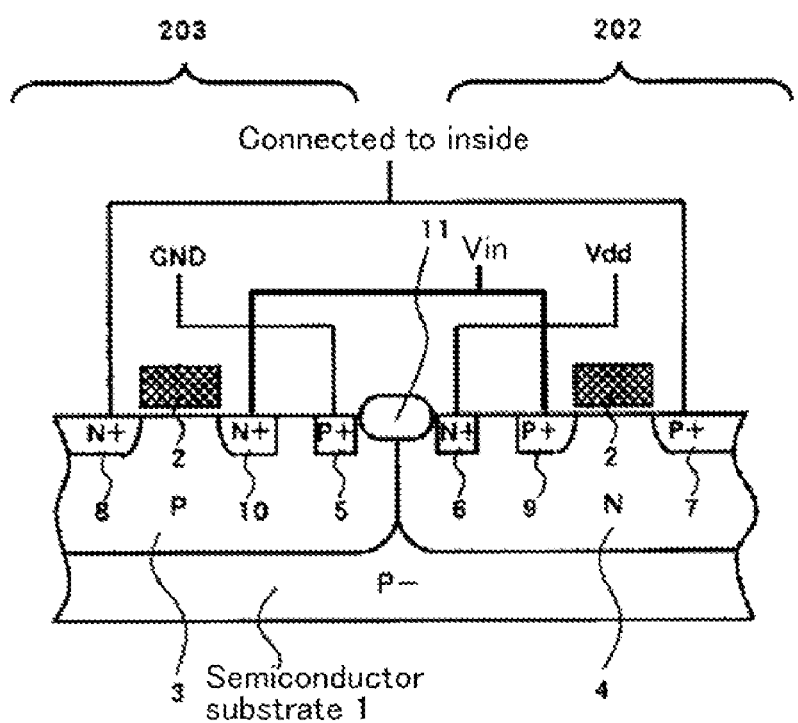
FIG. 3B is a partial schematic cross-sectional view taken along the line X201-X201 in FIG. 2B.

FIG. 3B is a partial schematic cross-sectional explanatory view of the protection elements 203 and 202 constituting the internal circuit 201 taken along the line X201-X201 in FIG. 2B. The p-type guard band region 5 of the n-type internal circuit element 203 is connected to the ground terminal GND to maintain a grounded potential. Furthermore, the n-type gourd band region 6 of the p-type internal circuit element 202 is connected to the power source terminal Vdd to maintain a power source potential. The n-type drain region 10 of the n-type internal circuit element 203 and the p-type drain region 9 of the p-type internal circuit element 202 are connected to the input terminal Vin to maintain a potential Vin. Furthermore, the n-type source region 8 of the n-type internal circuit element 203 and the p-type source region 7 of the p-type internal circuit element 202 are connected to an internal element.

Figure 4A:
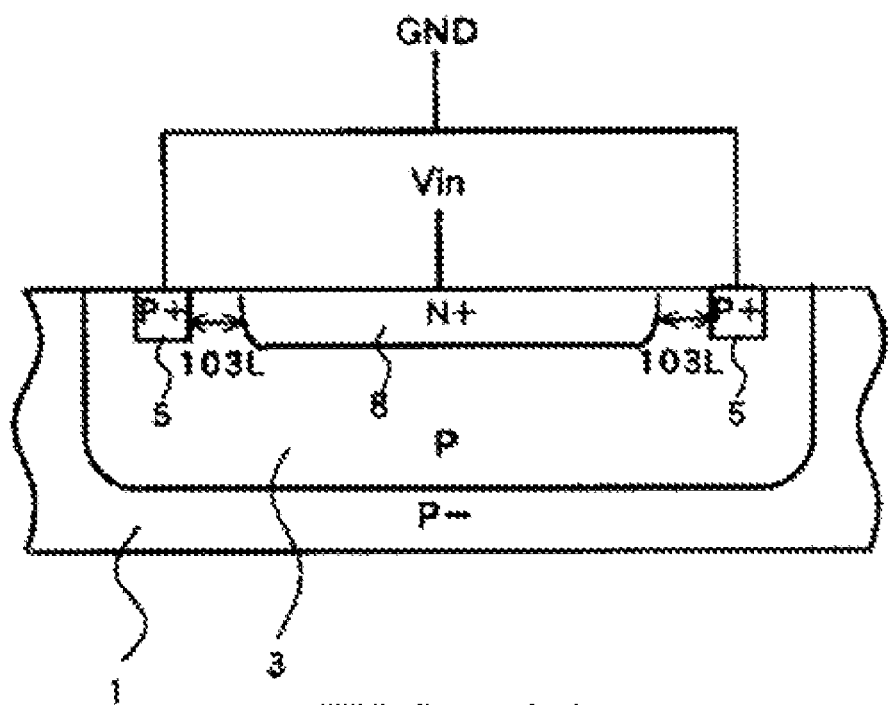
FIG. 4A is a partial schematic cross-sectional view taken along the line Y103-Y103 in FIG. 2A.
Figure 4B:
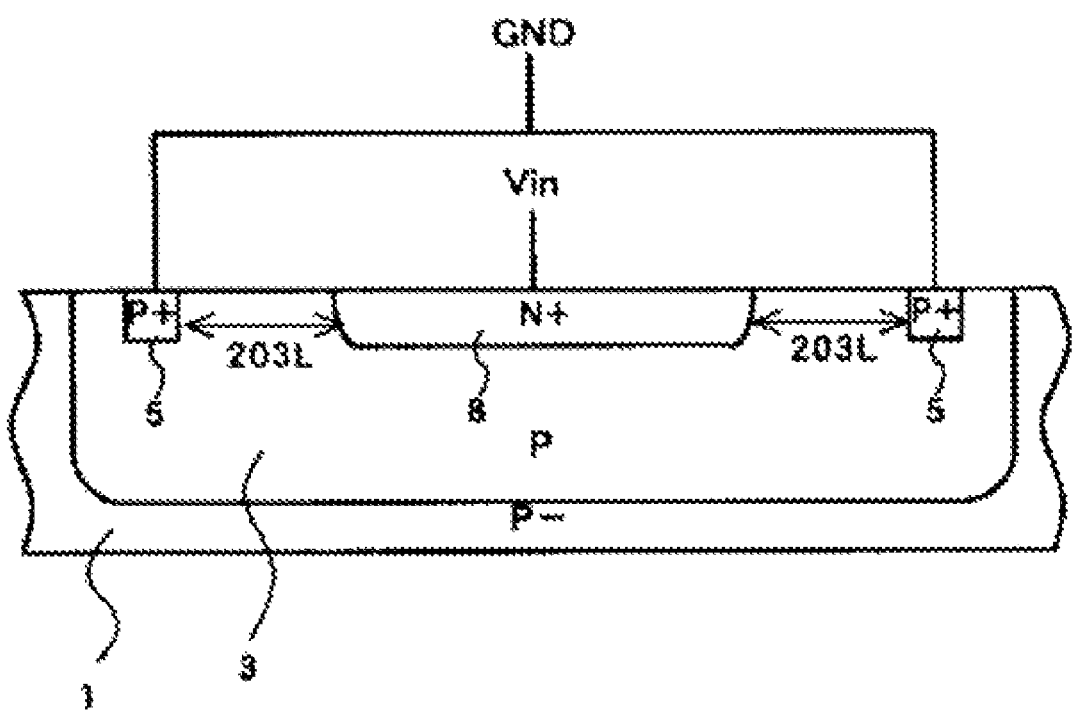
FIG. 4B is a partial schematic cross-sectional view taken along the line Y203-Y203 in FIG. 2B.

FIG. 4A is a partial cross-sectional schematic explanatory view showing the n-type protection element 103 constituting the protection circuit 101 taken along the line Y103-Y103 in FIG. 2A. FIG. 4B is a partial cross-sectional schematic explanatory view showing the n-type internal circuit element 203 constituting the internal circuit 201 taken along the line Y203-Y203 in FIG. 2B. In this embodiment, as to the shortest distance between the p-type guard band region 5 connected to the ground terminal GND and the n-type drain region 8 connected to the input terminal Vin, the shortest distance 103L of the n-type protection element 103 is designed to be shorter than the shortest distance 203L of the n-type internal circuit element 203. In this embodiment, for example, it can be designed such that the shortest distance 103L is set to 7 μm and the shortest distance 203L is set to 8 μm.

Figure 5A:
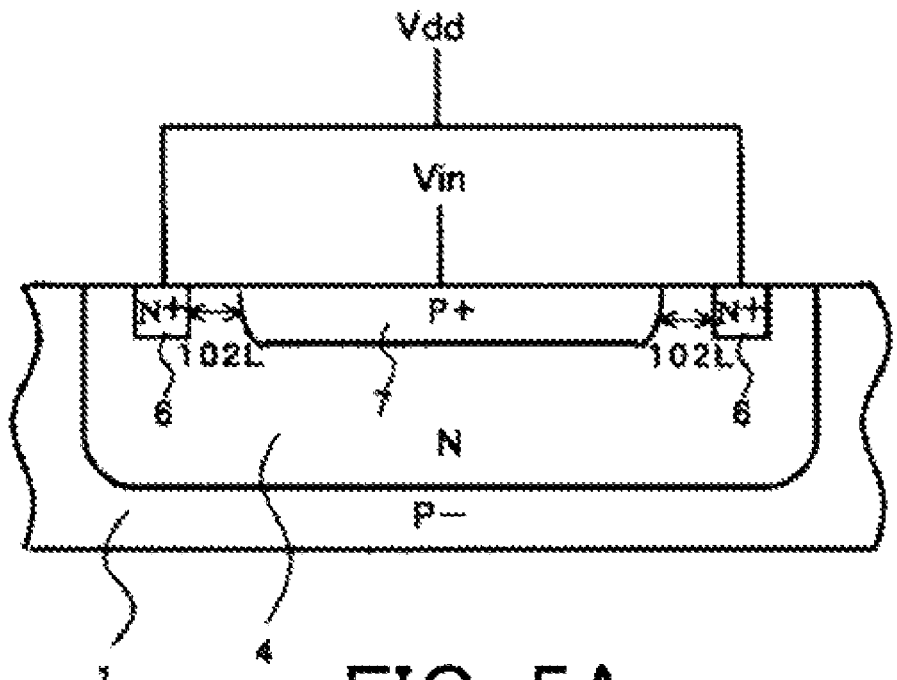
FIG. 5A is a partial schematic cross-sectional view taken along the line Y102-Y202 in FIG. 2A.
Figure 5B:
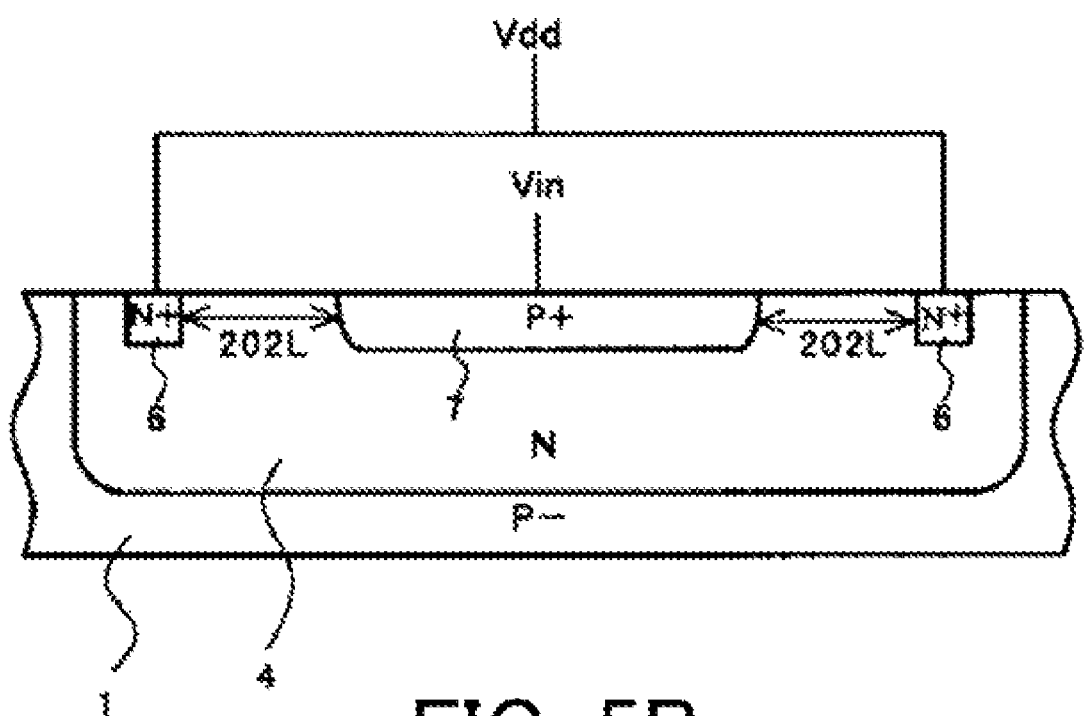
FIG. 5B is a partial schematic cross-sectional view taken along the line Y202-Y202 in FIG. 2A.

In the same manner, FIG. 5A is a partial cross-sectional schematic explanatory view showing the p-type protection element 102 constituting the protection circuit 101 taken along the line Y102-Y102 in FIG. 2A. FIG. 5B is a partial cross-sectional schematic explanatory view showing the p-type internal circuit element 202 constituting the internal circuit 201 taken along the line Y202-Y202 in FIG. 2B. In this embodiment, as to the shortest distance between the n-type guard band region 6 connected to the power source terminal Vdd and the p-type drain region 7 connected to the input terminal Vin, the shortest distance 102L of the p-type protection element 102 is designed to be shorter than the shortest distance 202L of the p-type internal circuit element 202. In this embodiment, for example, it can be designed such that the shortest distance 102L is set to 7 μm and the shortest distance 202L is set to 8 μm.

Hereinafter, the following explanation will be directed to the operation of the protection circuit 101 of the aforementioned semiconductor apparatus when ESD is impressed.

When a negative electrostatic pulse with respect to the ground terminal GND is impressed on the input terminal Vin, the parasitic PN diode between the drain electrode and the substrate electrode of the n-type protection element 103 of the n-type protection element 103 is operated forwardly. In the same manner, when a positive electrostatic pulse with respect to the power supply terminal Vdd is impressed on the input terminal Vin, the parasitic PN diode between the drain electrode and the substrate electrode of the p-type protection element 102 is operated forwardly. At the time of discharging static electricity, the input terminal is clamped at a low voltage below 1 V due to the forward operation of the diode. Therefore, even if it is designed such that the distance 103L and the distance 203L are identical, or the distance 102L and the distance 202L are identical, the internal circuit 201 will be protected against damage from electrostatic discharge (ESD).

When a positive electrostatic pulse with respect to the ground terminal GND is impressed on the input terminal Vin, or when a negative electrostatic pulse with respect to the power source terminal Vdd is impressed on the input terminal Vin, the parasitic PN diode between the drain electrode and the substrate electrode of the n-type protection element 103 is operated reversely. When the reverse-direction voltage to be applied to the parasitic PN diode between the drain electrode-substrate electrode exceeds the PN-junction withstand voltage, the PN-junction will be broken down to cause a reverse-direction saturation current. This reverse-direction saturation current causes collisional ionization of carriers at the drain region end portion of the MOS transistor This in turn generates a substrate current flowing from the drain region end portion towards the substrate electrode. The substrate current causes a substrate potential raise in the case of an n-type MOS transistor and causes a substrate potential drop in the case of a p-type MOS transistor. As a result, when the PN junction between the substrate electrode and the source electrode of the MOS transistor is biased forwardly, the so-called snap-back operation occurs, i.e., the MOS transistor will be operated as a parasitic lateral bipolar transistor. Thus, when a positive electrostatic pulse with respect to the ground terminal GND is impressed on the input terminal Vin, or when a negative electrostatic pulse with respect to the power source terminal Vdd is impressed on the input terminal Vin, the protection circuit 101 causes the so-called snap-back operation to thereby discharge static electricity. Thus, the internal circuit 201 can be protected from being damaged by electrostatic discharge (ESD)

As discussed above, in the semiconductor apparatus according to the embodiment of the present invention, the shortest distance 102L of the protection element 102 and the shortest distance 103L of the protection element 103 are set to be shorter than the shortest distance 202L of the internal circuit element 202 and the shortest distance 203L of the internal circuit element 203, respectively. In this case, in the n-type protection element 103, the distance between the end portion of the n-type drain 8 where substrate current is generated and the p-type guard band region 5 becomes shorter. As a result, the electric potential of the p-type guard band region 5 easily rises, which easily causes a snap-back operation. In the same manner, in the p-type protection element 102, the distance between the end portion of the p-type drain 7 where substrate current is generated and the n-type guard band region 6 becomes shorter. Therefore, the electric potential of the n-type guard band region 6 easily drops, which easily causes a snap-back operation. As a result, the protection circuit 101 can operate earlier than ESD surge starts flowing into the internal circuit 201.

The aforementioned technical effects only rely on the distance between the drain region and the guard band region. Therefore, the guard band region in the internal circuit element and the guard band region in the protection element are not required to be symmetrical. For example, the distance between the source region and the guard band region in the crossing direction of the source region and the drain region in the internal circuit element and that in the protection element can be identical. That is, the distance 102XL and the distance 202XL as well as the distance 103XL and the distance 203XL can be set to be identical. In this case, in the crossing direction of the source region and the drain region, the size of the guard band region in the internal circuit element and the size of the guard band region in the protection element can be set to be identical, which enables miniaturization of the semiconductor apparatus as a whole as compared with the case in which the guard band region in the internal circuit element and the guard band region in the protection element are set to be symmetrical.

Figure 6:
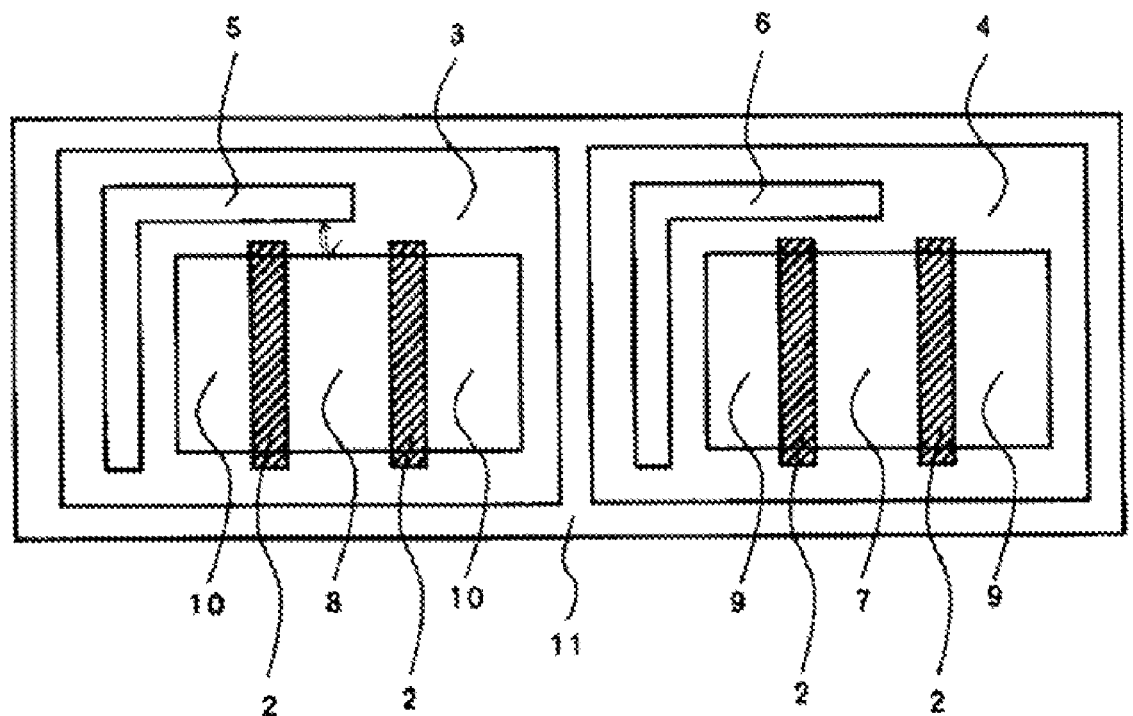
FIG. 6 is a schematic explanatory view showing another embodiment of the present invention.
Figure 7:
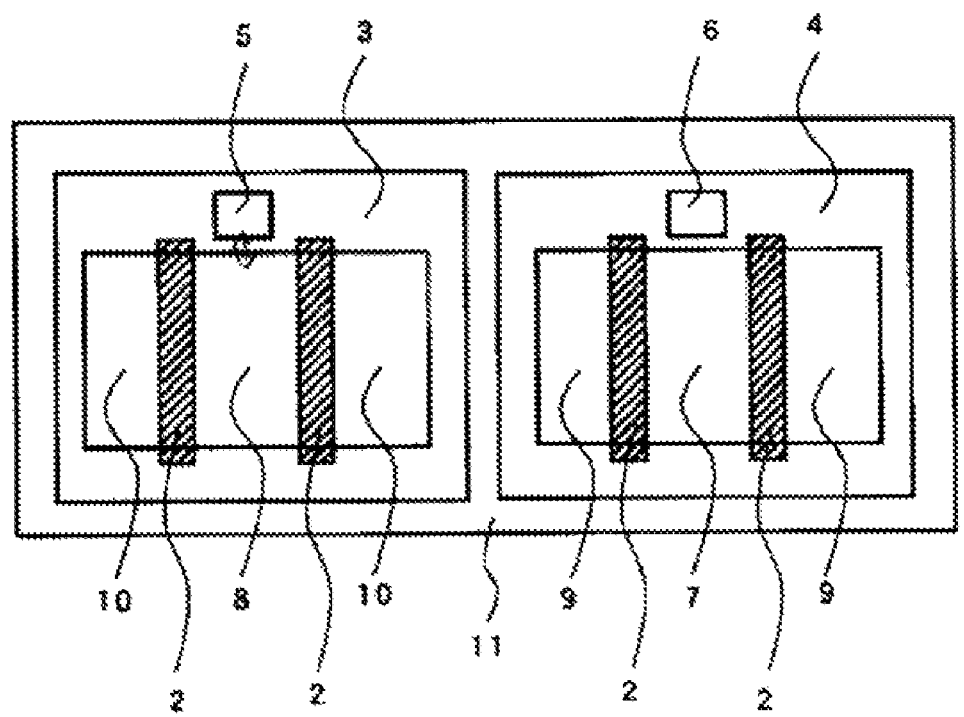
FIG. 7 is a schematic explanatory view showing still another embodiment of the present invention.

In the aforementioned embodiment, the guard band region is formed into a rectangular shape. The configuration of the guard band region, however, is not limited to the above, and can be arbitrarily changed depending on the application. For example, in the case of a low withstand voltage transistor, the well electric potential fixing strength is not usually required as compared with a high withstand voltage transistor. Accordingly, like n-type MOS transistors shown in FIGS. 6 and 7, it can be configured such that a part of a guard band region is located adjacent to the drain region without forming the guard band region into a rectangular shape. In this case, the area of the guard band region can be decreased as compared with the rectangular shaped guard band region, resulting in a compact semiconductor apparatus.

Furthermore, the aforementioned explanation is directed to the case in which the external terminal is an input terminal. However, it should be noted that the present invention can also be applied to the case in which the external terminal is an output terminal, an input/output terminal or a power source terminal.

Furthermore, in the aforementioned embodiments, the protection element is a COMS inverter. The present invention, however, can also be applied to the case in which the protection element is a single n-type MOS transistor or a single p-type MOS transistor.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a)"means for" or "step for" is expressly recited; b) a corresponding function is expressly recited; and c) structure, material or acts that support that structure are not recited. In this disclosure and during the prosecution of this application, the terminology "present invention" or "invention" is meant as an non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof and/or any portion thereof etc. In some examples, various embodiments may include overlapping features. In this disclosure and during the prosecution of this case, the following abbreviated terminology may be employed: "e.g." which means "for example;" and "NB" which means "note well."

What is claimed is:

1. A semiconductor apparatus equipped with an internal circuit including a semiconductor element and a protection circuit including a semiconductor element for protecting the internal circuit against damage from electrostatic discharge (ESD),
   wherein the semiconductor element constituting the internal circuit includes a drain region formed at a surface portion of a substrate of semiconductor material and connected by an external terminal, a source region formed at the surface portion of the substrate of semiconductor material and connected by an external terminal, and a guard band region formed adjacent to the drain region,
   wherein the semiconductor element constituting the protection circuit includes a drain region formed at a surface portion of a substrate of semiconductor material and connected by an external terminal, a source region formed at the surface portion of the substrate of semiconductor material and connected by an external terminal, and a guard band region formed adjacent to the drain region, and
   wherein a shortest distance between the drain region and the guard band region in the semiconductor element of the protection circuit in a first direction perpendicular to a second direction along which the drain region and the source region are arranged is set to be shorter than a shortest distance between the drain region and the guard band region in the semiconductor element of the internal circuit in a third direction perpendicular to a forth direction along which the drain region and the source region are arranged, wherein the first direction, the second direction, the third direction, and the fourth direction each extend on a surface of the semiconductor element.

2. The semiconductor apparatus as recited in claim 1, wherein the semiconductor element is a MOS transistor.

3. The semiconductor apparatus as recited in claim 2, wherein the guard band region is formed along at least a part of the drain region.

4. The semiconductor apparatus as recited in claim 2, wherein the guard band region is formed so as to fully surround the drain region.

5. The semiconductor apparatus as recited in claim 4, wherein the guard band region is formed into a rectangular shape fully surrounding the drain region.

6. The semiconductor apparatus as recited in claim 1,
   wherein the semiconductor element constituting the internal circuit has a source region, a drain region and a guard band region surrounding the source region and the drain region,
   wherein the semiconductor element constituting the protection circuit has a source region, a drain region and a guard band region surrounding the source region and the drain region,
   wherein a distance between the source region and the guard band region of the semiconductor constituting the internal circuit and a distance between the source region and the guard band region of the semiconductor constituting the protection circuit are set to be identical, and
   wherein the shortest distance between the drain region and the guard band region in the semiconductor element of the protection circuit is set to be shorter than the shortest distance between the drain region and the guard band region in the semiconductor element of the internal circuit.

7. The semiconductor apparatus as recited in claim 1, wherein the protection circuit is a CMOS type circuit including a first conductive type MOS transistor and a second conductive type MOS transistor.

8. The semiconductor apparatus as recited in claim 7, wherein a source region, the guard band region and a gate electrode of the first conductive type MOS transistor are connected to a ground terminal, and wherein a source region, the guard band region and a gate electrode of the second conductive type MOS transistor are connected to a power source terminal.

9. The semiconductor apparatus as recited in claim 1, wherein the external terminal is one of an input terminal, an output terminal, an input/output terminal and a power source terminal.

10. The semiconductor apparatus as recited in claim 1,
   wherein the semiconductor element constituting the protection circuit has outer sides including a first side defined along the drain region and extending in the second direction and a second side defined along the source and extending in the first direction, and the shortest distance between the drain region and the guard band region in the semiconductor element of the protection circuit is defined between the first side of the drain region and the guard band region, and
   wherein the semiconductor element constituting the internal circuit has outer sides including a third side defined along the drain region and extending in the fourth direction and a forth side defined along the source and extending in the third direction, and the shortest distance between the drain region and the guard band region in the semiconductor element of the internal circuit is defined between the third side of the drain region and the guard band region.

* * * * *